United States Patent
Hackl et al.

(10) Patent No.: US 10,598,718 B2
(45) Date of Patent: Mar. 24, 2020

(54) METHOD AND DEVICE FOR INSULATION FAULT LOCATION HAVING AN ADAPTIVE TEST CURRENT DETERMINATION

(71) Applicant: Bender GmbH & Co. KG, Gruenberg (DE)

(72) Inventors: Dieter Hackl, Fernwald (DE); Oliver Schaefer, Gruenberg (DE)

(73) Assignee: BENDER GMBH & CO. KG, Gruenberg (DE)

(*) Notice: Subject to any disclaimer, the term of this patent is extended or adjusted under 35 U.S.C. 154(b) by 292 days.

(21) Appl. No.: 15/248,598

(22) Filed: Aug. 26, 2016

(65) Prior Publication Data
US 2017/0067953 A1    Mar. 9, 2017

(30) Foreign Application Priority Data

Sep. 3, 2015  (DE) .......................... 10 2015 216 915

(51) Int. Cl.
| | | |
|---|---|---|
| *G01R 31/08* | (2020.01) | |
| *G01R 27/18* | (2006.01) | |
| *G01R 31/02* | (2006.01) | |
| *G01R 31/14* | (2006.01) | |

(52) U.S. Cl.
CPC ........... *G01R 31/088* (2013.01); *G01R 27/18* (2013.01); *G01R 31/025* (2013.01); *G01R 31/14* (2013.01)

(58) Field of Classification Search
CPC .......................... G01R 31/025; G01R 31/1272
See application file for complete search history.

(56) References Cited

U.S. PATENT DOCUMENTS

| | | | | |
|---|---|---|---|---|
| 2009/0085575 A1* | 4/2009 | Lindsey | ............... | G01R 31/025 324/510 |
| 2011/0001486 A1* | 1/2011 | Abouda | ............... | G01R 31/007 324/537 |
| 2014/0097854 A1* | 4/2014 | Hermeling | ........... | G01R 27/025 324/509 |
| 2015/0077130 A1 | 3/2015 | Hackl | | |

FOREIGN PATENT DOCUMENTS

| | | |
|---|---|---|
| CN | 104714124 A | 6/2015 |
| CN | 104793054 A | 7/2015 |
| DE | 102011050590 A1 | 11/2012 |
| DE | 102013218836 A1 | 3/2015 |
| EP | 1593983 A1 | 11/2005 |
| EP | 1855366 A2 | 11/2007 |
| EP | 2664932 A1 | 11/2013 |
| EP | 2851692 A1 | 3/2015 |

\* cited by examiner

*Primary Examiner* — Noam Reisner
(74) *Attorney, Agent, or Firm* — King & Schickli, PLLC

(57) ABSTRACT

The invention relates to a method for insulation fault location in an IT power supply system, comprising the process steps: feeding of a test current, detecting of a test current portion in a branch of the IT power supply system and evaluating the detected test current portion. Furthermore, the invention relates to an insulation fault location for an IT power supply system having a test current generator for supplying a test current, having a test current sensor for detecting a test current portion in a branch of an IT power supply system and having an analyzing device for evaluating the detected test current portion. According to the invention, the insulation fault location system comprises a computing unit for adaptively determining a test current parameter of the test current depending on an electric system parameter of the IT power supply system.

10 Claims, 2 Drawing Sheets

METHOD AND DEVICE FOR INSULATION FAULT LOCATION HAVING AN ADAPTIVE TEST CURRENT DETERMINATION

This application claims the benefit of German Patent Application Ser. No. 10 2015 216 915.4, filed Sep. 3, 2015, the disclosure of which is incorporated herein by reference.

TECHNICAL FIELD

The invention relates to a method for insulation fault location in an IT power supply system, comprising the process steps: feeding of a test current, detecting of a test current portion in a branch of the IT power supply system and evaluating the detected test current portion.

Furthermore, the invention relates to an insulation fault location system for an IT power supply system, having a test current generator for supplying a test current, having a test current sensor for detecting a test current portion in a branch of an IT power supply system and having an analyzing device for evaluating the detected test current portion.

BACKGROUND

Due to the inherent safety of IT power supply systems (French: Isolé Terre—IT), a continuous power supply of the user supplied by the IT power supply system can be ensured, even if a first insulation fault has occurred, since the active parts of the IT power supply system are separated from the ground potential—with respect to "ground"—and a closed electric circuit cannot be formed in this first fault case. A first insulation fault occurs, for example, if there is an unintended electric connection between an active conductor of the IT power supply system and the conductive casing of an operating part (user).

Provided that the insulation state of the IT power supply system is continuously monitored by an insulation monitoring device, the IT power supply system can still be operated without a time limitation, even when a first fault has occurred, however, the first fault is to be removed as quickly as practically possible according to the recommendation of standards DIN VDE 0100-410 and IEC 60364-4-41, respectively.

A first insulation fault is recognized and reported by the insulation monitoring device. This report starts an insulation fault location by a test current being produced by a test current generator of an insulation fault location system and being supplied into the IT power supply system at a central location. In the branches of the IT power supply system involved in the fault location, a test current sensor detects whether a significant test current portion flows into the respective branch.

The signals of the test current sensor are centrally detected in an analyzing device and an insulation fault localization is carried out based on these signals.

According to the state of the art, the test current parameters, in particular the test current amplitude as well as the test current pulse duration with a pulse-shaped test current, of the test current produced and supplied by the insulation fault location system are set once when planning and installing the safety-critical measures for the IT power supply system. Thereby, a compromise is to be made between the following requirements: (1) preventing risk to persons and preventing fire hazards by the test current, (2) no impediment of the function of the IT power supply system and the connected operating parts by the test current and (3) localization of even high-resistance insulation faults.

In practice, the test current is limited to a few 10 mA or even only a few mA in order to safely fulfill the requirements (1) and (2).

In particular in widely branched IT power supply systems, problems regarding the size and/or the distribution of network leakage capacitances can occur. These network leakage capacitances are mostly electrically parallel to the fault resistances to be detected. A portion of the test current therefore flows through these capacitances and, when the test current is set too low, leads to high-resistance fault resistances not being detected, in a worst case scenario. The distribution of the test current on multiple faulty branches in a badly maintained IT power supply system poses another problem. Multiple faults are difficult to detect with small test current amplitudes, since the low test current distributes itself on multiple fault resistances and the sensitivity threshold of the test current sensors can fall short. Ultimately, disturbing elements can occur in IT power supply systems which impede or prevent an insulation fault location, should the test current portion in the faulty branch is so low that it is hidden by disturbing signals and cannot be detected or detected sufficiently exact by the test current sensor.

The circumstances mentioned above can therefore result in an insulation fault not being located.

Known measures for solving these problems consist of a manual adjustment of the test current parameter, on the one hand, for example by manually increasing the test current amplitude, as far as this is possible in the installed insulation fault location system. However, since the estimation of a maximal admissible test current amplitude requires considerable expertise in a present fault case, service personnel trained specifically in this area is employed for this purpose. Thus, the maintenance measures are delayed and increase in price in an unfavorable way.

As an additional measure, on the other hand, the insulation fault location system or components of the installed insulation fault location system can be substituted by a system having a higher test current amplitude, provided such a system is available on the market. A substitution of such components in critical IT power supply systems often requires a renewed inspection by an expert.

Furthermore, the fact that the test current amplitude of currently available insulation fault location systems is limited to low values of only a few 10 mA by the producer is still another disadvantage. Therefore, the only possibility that remains in the problematic cases mentioned above is to carry out the fault location without the help of insulation fault location systems, for example by shutting down branches (sub-systems).

The solutions mentioned above are therefore not always satisfactory in practice. Moreover, a delay in localizing and removing a first fault can lead to an unnecessary strain on the IT power supply system or even to a shutting down of the power supply.

Therefore, the object of the present invention is to enhance a method and a device for insulation fault location in such a way that a reliable insulation fault location can be carried out in an economically feasible way, wherein at the same time a high electric safety is ensured.

SUMMARY

With respect to a method, this object is attained in connection with the preamble of claim 1 in that a test current parameter of the test current is adaptively determined depending on an electric system parameter of the IT power supply system.

The idea of the present invention is based on automatically adjusting at least one characterizing parameter of the test current, in particular the current amplitude and the current (signal) form, to the IT power supply system in such a way that an adequate test current for the optimal fault location, according to the requirements (1) to (3) mentioned above, is supplied. The test current is automatically adjusted to the configuration and the electric state of the IT power supply system on request or in set updating intervals depending on, meaning considering and evaluating, at least one electric system parameter of the IT power supply system.

In another embodiment of the invention, a test current amplitude is adaptively determined as a test current parameter.

A parameter for describing the test current is its amplitude (test current amplitude). This test current amplitude is automatically determined according to a predetermined computing instruction depending on an electric system parameter of the IT power supply system, preferably depending on the size of the insulation resistance.

Thus it is obtained that an optimal maximum test current required for fault location can be used without causing a risk to persons or device components.

Furthermore, a test current pulse duration of a pulse-shaped test current is adaptively determined as a test current parameter.

Another parameter for describing the test current presents the test current pulse duration in a pulse-shaped test current. Depending on at least one electric system parameter of the IT power supply system, the test current pulse duration is adaptively determined—preferably depending on the size and distribution of the network leakage capacitances in order to enable their complete charging and to be able to carry out the measurement in a steady state.

Hence, a temporally optimized determination of the fault position results in connection with the possibility to also be able to recognize high-resistance insulation faults.

A specific supply of a test current into a conductor phase is carried out advantageously.

The specific supply of the test current into a conductor phase enables the use of a maximum test current without the function of the IT power supply system being negatively influenced. Thereby, the specific supply can also consist in a weighted distribution of the (entire) test current, wherein the test current is adaptively determined for every conductor phase of the IT power supply system in such a way that a maximum test current regarding its amplitude is supplied with an optimally adjusted test current pulse duration without causing a risk to persons or an impediment of a function.

One or more of the following parameters of the IT power supply system are evaluated as electric system parameters: insulation resistance, distribution of the insulation resistance on individual conductor phases, network leakage capacitance, momentary displacement voltage, maximum admissible displacement voltage, maximum admissible active power in a fault resistance, time limitation for the flow of a maximum test current.

One or more of the following system-related specifications are evaluated as another electric system parameter: system-relevant standards, specifications of the system configuration, safety-critical categorization.

In a preferred embodiment of the invention, the electric system parameter is statically configured or dynamically determined.

As a statically configured electric system parameter, the parameter or the indication to be evaluated is saved as a set value in a storage device. The dynamic determination of the electric system parameter can be carried out by direct measuring or by data transfer of an already determined parameter, for example by communication of the insulation resistance via a data connection coming from an insulation monitoring device.

It is advantageous if a sequence of the adaptive determination of the test current parameter is set by means of a computer program.

The adaptive determination of the test current parameter is carried out by software controls via program commands. This opens up the possibility of flexibly reacting to changes to the IT power supply system or to changed requirements.

A possible approach to adjust the optimal test current amplitude required for fault location, for example, is to slowly increase the test current amplitude until an analyzing device detects a faulty branch or the maximum admissible test current amplitude has been reached or a different relevant electric system parameter of the IT power supply system has been reached, which prohibits any further increase of the test current amplitude.

The computer program accesses an expert knowledge base and adaptively adjusts the test current parameter or proposes the determined test current parameter for use, taking into account the electric system parameter.

Retrievable expert knowledge on an optimal approach for the insulation fault location is saved in the insulation fault location system, said approach using the known relevant electric system parameters of the IT power supply system in order to adjust the optimal test current parameter required for fault location or to propose the determined parameter value to the user of the application.

With respect to a device, the object of the invention is attained in connection with the preamble of claim 10 by the insulation fault location system comprising a computing unit for adaptively determining a test current parameter depending on an electric system parameter of the IT power supply system.

When realizing the method according to the invention, the insulation fault location system comprises a computing unit according to the invention which comprises a software technical implementation of the adaptive parameter determination.

The insulation fault location system according to the invention and the method based on the insulation fault location system enable to supply an adaptively determined test current optimally suitable for fault location without further expertise of the service personnel.

The attained simplification in the execution of the insulation fault location leads to an increased safety during operation and maintenance of an IT power supply system, since the fault localization is carried out faster, thus preventing risks which occur due to an insulation fault. Thereby, the insulation fault location is made significantly more reliable and economical, in particular in complex IT power supply systems.

BRIEF DESCRIPTION OF THE DRAWING FIGURES

Other advantageous embodiment features become apparent from the following description and from the drawing, which illustrates a preferred embodiment of the invention with the aid of an example. In the drawing.

DETAILED DESCRIPTION

Figure 1:
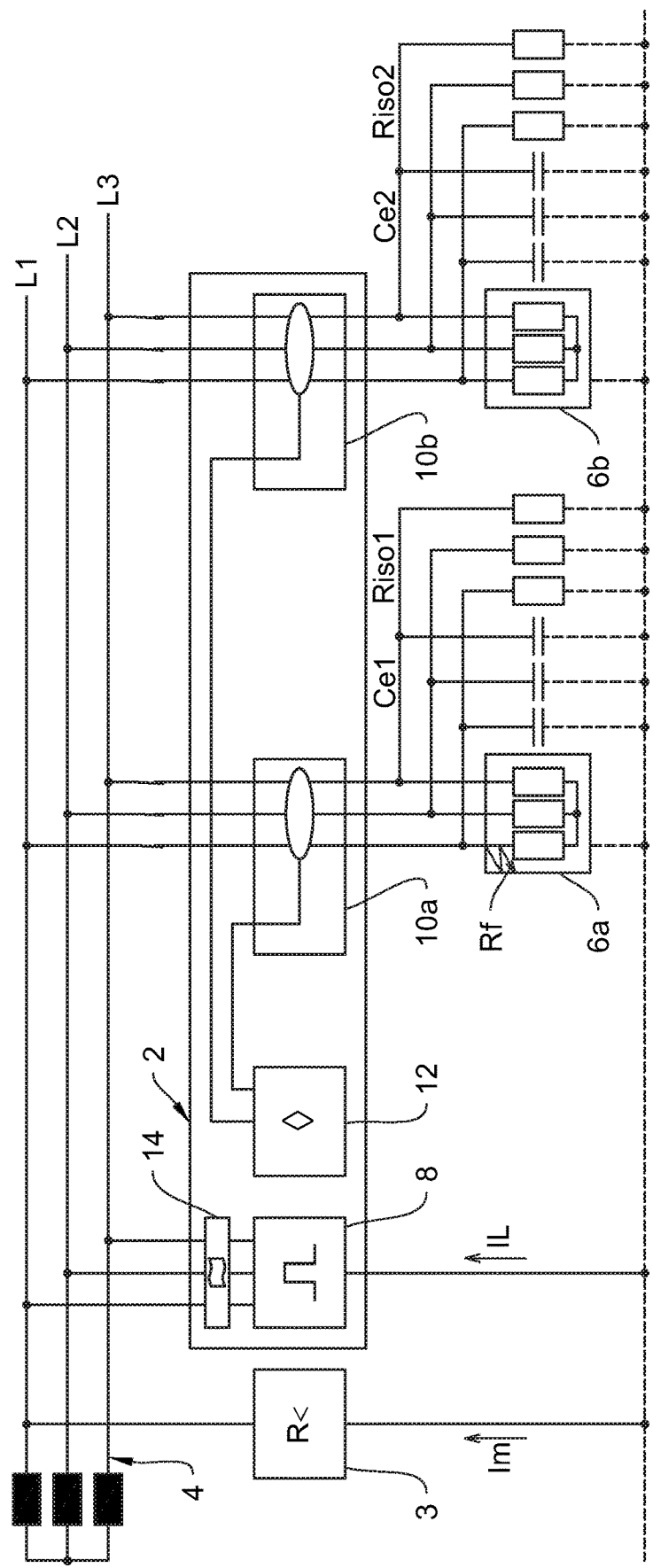
FIG. 1 shows an insulation fault location system according to the invention.

FIG. 1 shows an insulation fault location system 2 according to the invention in a three-phase IT power supply system 4 having two branches which each supply a user 6a, 6b. The IT power supply system 4 is further characterized by the leakage capacitances Ce1, Ce2 and the insulation resistances Riso1, Riso2.

The IT power supply system 4 is monitored by an insulation monitoring device 3 which imprints a measuring current Im into the IT power supply system 4 for defining the entire insulation resistance of the IT power supply system 4.

The insulation fault location system 2 comprises a test current generator 8 which imprints a test current IL, independent from the measuring current Im of the insulation monitoring device 3, between the live conductors L1, L2, L3 and the ground PE into the IT power supply system 4. A test current sensor 10a, 10b is arranged in each of the branches of the IT power supply system, said sensor 10a, 10b detecting a test current portion flowing in the branch. If there is an insulation fault Rf at the user 6a, as illustrated in FIG. 1, the test current portion detected by the test current sensor 10a is non-zero in this faulty branch and the test current sensor 10a sends a respective measuring signal to an analysis device 12. The analysis device 12 receives the measuring signals of all test current sensors 10a, 10b and localizes the fault position based on the allocation of test current sensor/branch.

According to the invention, the insulation fault location system 2 comprises a computing unit 14 which adaptively determines the test current IL, in particular its characteristic parameters test current amplitude and test current pulse duration.

Figure 2:
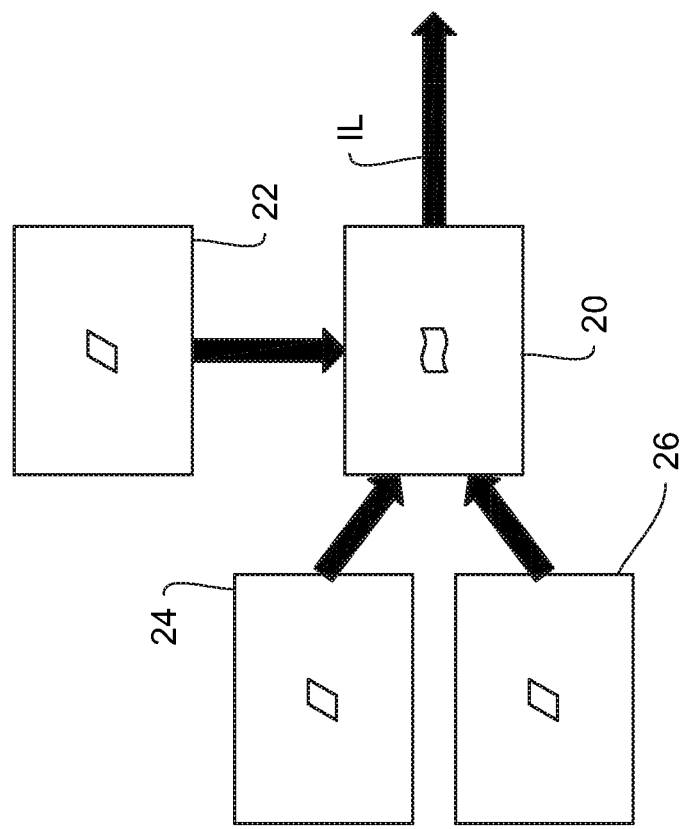
FIG. 2 shows schematically the principle of the adaptive determination of a test current parameter according to the inventive method.

The principle of the adaptive determination of a test current parameter of the test current IL according to the inventive method is illustrated in FIG. 2. A computer program 20 forms a central element, said computer program 20 carrying out the adaptive determination by means of program commands. Thereby, the computer program 20 accesses an expert knowledge base 22 which comprises instructions regarding an optimal, meaning reliable and fast, approach for the occurring operation case. In order to determine a suitable test current on the basis of this approach, the computer program 20 uses statically configured electric system parameters 24 and/or dynamically determined electric system parameters 26 of the IT power supply system 4.

The invention claimed is:

1. Method for insulation fault location in an IT power supply system (4), comprising the process steps:
   supplying of a pulse-shaped test current (IL),
   detecting of a test current portion in a branch of the IT power supply system (4),
   evaluating the detected test current portion,
   characterized by
   adaptive determining of a test current parameter of the test current (IL) depending on an electric system parameter (24, 26) of the IT power supply system (4), wherein as the electric system parameter of the IT power supply system (4), an insulation resistance is evaluated.

2. Method according to claim 1,
   characterized in that
   a test current amplitude is adaptively determined as a test current parameter.

3. Method according to claim 1,
   characterized in that
   a test current pulse duration of the pulse-shaped test current (IL) is adaptively determined as a test current parameter.

4. Method according to claim 1,
   characterized in that
   a specific supply of a test current (IL) in a conductor phase (L1, L2, L3) of the IT power supply system (4) is carried out.

5. Method according to claim 1,
   characterized in that
   one or more of the following parameters of the IT power supply system (4) are evaluated as electric system parameters (24, 26): distribution of the insulation resistance on individual conductor phases, network leakage capacitance, momentary displacement voltage, maximum admissible displacement voltage, maximum admissible active power in a fault resistance, time limitation for the flow of a maximum test current.

6. Method according to claim 1,
   characterized in that
   one or more of the following system-related specifications are evaluated as electric system parameters (24, 26): system-relevant standards, specifications of the system configuration, safety-critical categorization.

7. Method according to claim 1,
   characterized in that
   the electric system parameter (24, 26) is statically configured or dynamically determined.

8. Method according to claim 1,
   characterized in that
   a sequence of the adaptive determination of the test current parameter is set by means of a computer program (20).

9. Method according to claim 8,
   characterized in that
   the computer program (20) accesses an expert knowledge base (22) and adaptively adjusts the test current parameter or proposes the determined test current parameter for use, taking into account the electric system parameter (24, 26).

10. Insulation fault location system for an IT power supply system (4) having a test current generator (8) for supplying pulse-shaped a test current (IL), having a test current sensor (10a, 10b) for detecting a test current portion in a branch of an IT power supply system (4), having an analyzing device (12) for evaluating the detected test current portion,
    characterized by
    a computing unit (14) for adaptively determining a test current parameter depending on an electric system parameter (24, 26) of the IT power supply system (4), wherein as the electric system parameter of the IT power supply system (4), an insulation resistance is evaluated.

* * * * *